(12) United States Patent
Popp et al.

(10) Patent No.: US 9,721,991 B2
(45) Date of Patent: Aug. 1, 2017

(54) ORGANIC OPTOELECTRONIC COMPONENT AND METHOD FOR OPERATING THE ORGANIC OPTOELECTRONIC COMPONENT

(71) Applicant: OSRAM OLED GmbH, Regensburg (DE)

(72) Inventors: Michael Popp, Freising (DE); Marc Philippens, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/432,537

(22) PCT Filed: Oct. 24, 2013

(86) PCT No.: PCT/EP2013/072318
§ 371 (c)(1),
(2) Date: Mar. 31, 2015

(87) PCT Pub. No.: WO2014/067852
PCT Pub. Date: May 8, 2014

(65) Prior Publication Data
US 2015/0243710 A1    Aug. 27, 2015

(30) Foreign Application Priority Data

Nov. 2, 2012  (DE) .................. 10 2012 220 020

(51) Int. Cl.
*H05B 37/02*    (2006.01)
*H05B 33/08*    (2006.01)
(Continued)

(52) U.S. Cl.
CPC .......... *H01L 27/288* (2013.01); *H01L 51/448* (2013.01); *H01L 51/5237* (2013.01);
(Continued)

(58) Field of Classification Search
CPC ............ H01L 2924/00; H01L 2924/00; H01L 27/288; H01L 2251/5361;
(Continued)

(56) References Cited

U.S. PATENT DOCUMENTS 7,460,222 B2   12/2008   Kalveram et al.
7,859,621 B2   12/2010   Zhang et al.
(Continued)

FOREIGN PATENT DOCUMENTS

CN    1364285 A    8/2002
EP    1467408 A2   10/2004
(Continued)

*Primary Examiner* — Jany Richardson
(74) *Attorney, Agent, or Firm* — Slater Matsil, LLP

(57) ABSTRACT

An organic optoelectronic component and a method for operating the organic optoelectronic component are disclosed. In an embodiment the organic optoelectronic component includes at least one organic light emitting element including an organic functional layer stack having at least one organic light emitting layer between two electrodes and at least one organic light detecting element including at least one organic light detecting layer, wherein the at least one organic light detecting element and the at least one organic light emitting element are laterally arranged on a common substrate.

18 Claims, 13 Drawing Sheets

(51) Int. Cl.
  *H01L 27/28* (2006.01)
  *H01L 27/32* (2006.01)
  *H01L 51/44* (2006.01)
  *H01L 51/52* (2006.01)

(52) U.S. Cl.
  CPC ...... *H01L 51/5246* (2013.01); *H01L 51/5253* (2013.01); *H05B 33/0896* (2013.01); *H01L 2251/5361* (2013.01)

(58) Field of Classification Search
  CPC ....... H01L 2924/12044; H01L 27/3269; H01L 27/3225; H05B 33/0896; H05B 37/0218
  See application file for complete search history.

(56) References Cited

U.S. PATENT DOCUMENTS

| | | | |
|---|---|---|---|
| 2001/0035848 A1 | 11/2001 | Johnson et al. | |
| 2003/0214240 A1* | 11/2003 | Lee | G09G 3/3208 315/169.1 |
| 2004/0031965 A1 | 2/2004 | Forrest et al. | |
| 2006/0264143 A1 | 11/2006 | Lee et al. | |
| 2007/0051945 A1* | 3/2007 | Nakayama | H01L 27/288 257/40 |
| 2008/0230792 A1 | 9/2008 | Jiang et al. | |
| 2009/0134309 A1 | 5/2009 | Leo et al. | |
| 2010/0201275 A1 | 8/2010 | Cok et al. | |
| 2011/0042766 A1 | 2/2011 | Kurokawa et al. | |
| 2011/0284721 A1 | 11/2011 | Iwabuchi et al. | |
| 2012/0056205 A1 | 3/2012 | Allard et al. | |
| 2012/0061689 A1 | 3/2012 | Yan et al. | |
| 2012/0091923 A1 | 4/2012 | Kastner-Jung et al. | |
| 2013/0105823 A1 | 5/2013 | Kurokawa | |
| 2014/0021491 A1* | 1/2014 | Meng | H01L 33/54 257/82 |

FOREIGN PATENT DOCUMENTS

| | | |
|---|---|---|
| EP | 2065698 A1 | 6/2009 |
| JP | 2003150117 A | 5/2003 |
| JP | 200781203 A | 3/2007 |
| WO | 0169583 A1 | 9/2001 |
| WO | 2004048881 A2 | 6/2004 |
| WO | 2004088627 A1 | 10/2004 |
| WO | 2010066245 A1 | 6/2010 |

\* cited by examiner

FIG. 16A
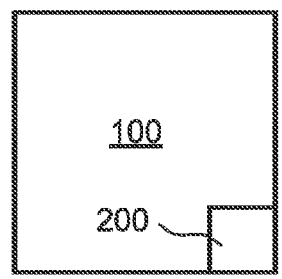
FIG. 16B
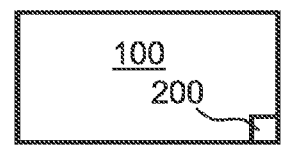
FIG. 16C
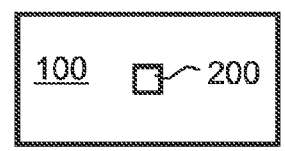
FIG. 16F
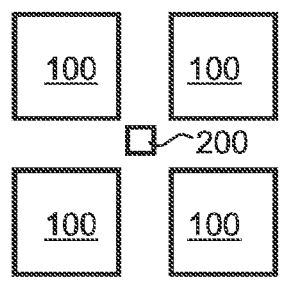
FIG. 16D
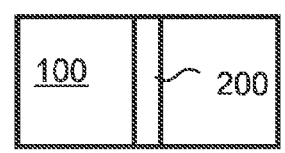
FIG. 16G
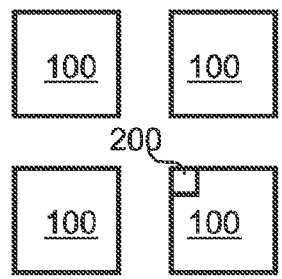
FIG. 16E

ORGANIC OPTOELECTRONIC COMPONENT AND METHOD FOR OPERATING THE ORGANIC OPTOELECTRONIC COMPONENT

This patent application is a national phase filing under section 371 of PCT/EP2013/072318, filed Oct. 24, 2013, which claims the priority of German patent application 10 2012 220 020.7, filed Nov. 2, 2012, each of which is incorporated herein by reference in its entirety.

TECHNICAL FIELD

An organic optoelectronic component and a method for operating the organic optoelectronic component are specified.

BACKGROUND

In illuminated environments, changed ambient conditions can change the illumination conditions or brightnesses. By way of example, the ambient conditions can change with regard to the current illumination, which corresponds to short-term processes, and as a result of ageing processes in the luminance sources used, which corresponds to long-term processes. Changed ambient conditions with regard to the illumination arise, for example, in the case of changed light incidence through windows into an illuminated room at different times of day. Surface light sources such as an organic light emitting diode (OLED), for instance, can furthermore be subject to ageing processes, as a result of which the luminance in total decreases over time depending on the OLED layer construction and processing. The decrease in the luminance can be caused, for example, by elevated temperatures which can occur during operation and can damage the organic materials.

In order to keep the luminance in the environment of a luminance source such as a surface light source, for instance, constant over time, the light emitted by the luminance source can be regulated, for example, by means of manual dimming or by means of an electronic circuit which controls the luminance source on the basis of a measurement signal from one or a plurality of externally connected sensors. As external sensors it is possible to use, for example, photodiodes, photoconductors, phototransistors or photothyristors for detecting the entire radiation power emitted by the luminous source at a preselected location, and, by means of an external interconnection or wiring, they can be part of a control of the luminous source. However, such a possibility usually requires a high complexity and causes additional costs. Manual dimming, by contrast, enables only imprecise coordination with lighting conditions actually present and causes an unnecessary waste of energy and, under certain circumstances, incorrect illumination conditions.

Since the known control possibilities for surface light sources have a high interconnection complexity or cannot be automated, an automatic readjustment of the luminance is not possible without considerable additional outlay.

SUMMARY OF THE INVENTION

In accordance with at least one embodiment, an organic optoelectronic component comprises at least one organic light emitting element comprising an organic functional layer stack having at least one organic light emitting layer between two electrodes. In particular, the at least one organic light emitting element is embodied as organic light emitting diode (OLED) which can emit visible light during operation through at least one of the electrodes. For this purpose, at least one of the electrodes is embodied as transparent.

Here and hereinafter, "transparent" denotes a layer which is transmissive to visible light. In this case, the transparent layer can be clearly translucent or at least partly light scattering and/or partly light absorbing, such that a layer designated as transparent can, for example, also be diffusely or milkily translucent. Particularly preferably, a layer designated here as transparent is embodied as transmissive to visible light as far as possible in such a way that in particular the absorption of light generated in the organic light emitting element is as low as possible.

By way of example, a transparent electrode can be composed of a transparent conductive oxide (TCO), graphene, a transparent metal or metallic network structures or can comprise such a material. The other of the two electrodes between which the organic functional layer stack of the organic light emitting element is situated can be embodied as reflective and comprise a metal, for example. As an alternative thereto, it is also possible for both electrodes to be embodied as transparent. In this case, the organic light emitting element can be embodied in particular as a transparent OLED.

The organic optoelectronic component furthermore comprises at least one organic light detecting element comprising at least one organic light detecting layer. In particular, the at least one organic light detecting element can be designed to convert light incident on the at least one organic light detecting layer into an electrically measurable signal, for instance a voltage, a current or an electrical resistance.

Furthermore, the organic optoelectronic component comprises a common substrate for the at least one organic light emitting element and the at least one organic light detecting element, which are arranged in particular on the common substrate in laterally adjacent area regions. The organic light emitting element and the organic light detecting element are furthermore arranged in one and the same plane as a result of the common arrangement on the same substrate in laterally adjacent area regions, wherein the organic light emitting element and the organic light detecting element in each case directly adjoin the substrate.

The common substrate can be in particular the sole substrate of the organic optoelectronic component. The functional layer stacks and the electrodes of the organic light emitting and light detecting elements of the organic optoelectronic component are in this case applied successively or simultaneously in particular on the common substrate, such that the common substrate is that substrate which is necessary and provided for producing the organic light emitting and light detecting elements. In other words, the organic light emitting and light detecting elements are not produced on dedicated substrates and then arranged on the common substrate, but rather are produced on the common substrate. Consequently, in this case, no further substrate is arranged in particular between the common substrate and the organic functional layers of the organic light emitting and light detecting elements.

Here and hereinafter, "lateral" denotes a direction parallel to the main extension plane of the common substrate. A lateral direction is thus directed, for example, perpendicularly to the stacking direction of the electrodes and of the organic functional layer stack of the at least one organic light emitting element.

In particular, the at least one organic light emitting element and the at least one organic light detecting element are arranged on the same side of the common substrate. Particularly preferably, with regard to further optoelectronic elements, that is to say further light emitting or light detecting elements, which can be arranged on the common substrate, the at least one organic light detecting element can be directly adjacent to the at least one organic light emitting element, that is to say that no further organic light emitting or light detecting elements are present in a lateral direction between the at least one organic light detecting element and the at least one organic light emitting element.

In accordance with a further embodiment, the at least one organic light detecting element is embodied and usable as organic photodiode. The organic photodiode can comprise in particular an organic functional layer stack between two electrodes, wherein the organic functional layer stack has as organic light detecting layer of the organic light detecting element at least one pn junction for generating charge carriers. By way of example, the organic photodiode, with regard to the electrodes and the organic functional layer stack, can have the same construction as the at least one organic light emitting element and can be operated inversely with respect to the at least one organic light emitting element, that is to say with opposite electrical polarity, as a result of which it may be possible that the manufacture of the organic optoelectronic component causes no or only low additional costs in comparison with an exclusively light emitting component. As an alternative thereto, the organic photodiode, in comparison with the organic light emitting element, can comprise other materials and/or other layer constructions with regard to the electrodes and/or the organic functional layer stack, as a result of which, although an additional outlay may be necessary during manufacture, the sensitivity of the at least one organic light detecting element can also be adapted in a targeted manner.

In accordance with a further embodiment, the at least one organic light detecting element is embodied and usable as organic photoconductor comprising an organic photoconductive material as organic light detecting layer, which material generates electrical charges upon irradiation by light. Organic photoconductive materials can be embodied, for example, in one layer on an electrically conductive layer, for example, an electrode. Furthermore, organic photoconductive materials can be embodied, for example, in at least two layers comprising at least one organic layer which generates charge carriers and an organic layer which transports charge carriers. Furthermore, an organic light detecting element embodied as an organic photoconductor can have the same construction as the at least one organic light emitting element.

Depending on the materials and construction of the at least one organic light detecting element, the latter can also be constructed simultaneously as photoconductor and photodiode. Such an organic light detecting element can be usable as photodiode with an electrical bias voltage and as photoconductor without an electrical bias voltage.

Furthermore, depending on the materials and construction used, the electrical resistance of the at least one organic light detecting element can also be measured, such that the at least one organic light detecting element can be embodied and usable as organic photoresistor.

In particular, it may be advantageous, as described above, if the at least one organic light detecting element and the at least one organic light emitting element have an identical construction. Furthermore, it may also be possible for the organic light detecting element to comprise only n- or p-conducting layers or an optoelectronic layer and for these to be identical to the corresponding layers of the organic light emitting element.

The at least one organic light emitting element and the at least one organic light detecting element, with regard to their respective electrodes and organic functional layers, are preferably embodied in a manner electrically isolated from one another on the substrate. In other words, the at least one organic light detecting element covers an area region on the common substrate which is spatially separated from the area region covered by the at least one organic light emitting elements on the common substrate. As an alternative thereto, depending on the electrical driving of the organic light emitting element and of the organic light detecting element, it may also be possible for these to have a common electrode.

In accordance with a further embodiment, the at least one organic light detecting element, with regard to its area occupation on the common substrate, is embodied as smaller than the at least one organic light emitting element. In particular, the at least one organic light detecting element can cover on the common substrate an area which is less than or equal to ten percent or less than or equal to five percent or less than or equal to one percent of the area covered by the at least one organic light emitting element on the common substrate. In other words, the majority of the common substrate can be covered with the at least one organic light emitting element or, if appropriate, with a plurality of organic light emitting elements, while the at least one organic light detecting element or, if appropriate, a plurality of organic light detecting elements occupy only a small area region, such that the organic optoelectronic component has during operation a luminous area which can substantially correspond to the total area of the common substrate.

In accordance with at least one embodiment, a method for operating the organic optoelectronic component comprises an electronic component, for example, a regulatable current and/or voltage source measures the light which is detected by the at least one organic light detecting element and which comprises ambient light, and regulates the at least one organic light emitting element depending on the measurement. The fact that the electronic component measures the light detected by the at least one organic light detecting element means, in particular, that the electronic component measures the electronically measurable signal of the at least one organic light detecting element.

By way of example, the electronic component, that is to say, for example, a regulatable current and/or voltage source, can be at least partly integrated into the organic optoelectronic component. In other words, the regulatable current and/or voltage source can be formed by an electronic component which is embodied as a hybrid or monolithic electronic circuit which can be integrated in the common substrate, for example, or which can be embodied in the form of additional functional layers on the common substrate. By way of example, for this purpose, the common substrate can comprise at least partly an integrated circuit on the basis of a semiconductor material, for example, silicon and/or printed electronics. As an alternative thereto, it may also be possible for the electronic component, that is to say, for example, for regulatable current and/or voltage source, to be embodied as an external electronic component which is interconnected with the organic optoelectronic component by means of suitable electrical connections such as, for instance, conductor tracks and/or wire connections.

Furthermore, it may also be possible for the at least one organic light emitting element and the at least one organic light detecting element to be interconnected separately from one another. For this purpose, the at least one organic light emitting element can be connected to an electronic component in the form of a current and/or voltage source, while the at least one organic light detecting element is connected to an electronic component in the form of a current and/or voltage and/or resistance measuring instrument.

The features and embodiments described above and below apply equally to the organic optoelectronic component and the method for operating the organic optoelectronic component.

As a result of the monolithic integration of the at least one organic light detecting element, which can have, for example, the same layer construction as the at least one organic light emitting element, on a preferably small, separated area region of the common substrate, in addition to the at least one organic light emitting element a sensor element can be integrated with low complexity in the organic optoelectronic component described here. Depending on the intensity of the light which is incident on the organic light detecting element and which is composed of the sum of all incident light sources, an electrically measurable signal such as, for instance, a photovoltage, a photocurrent or a resistance change is generated which, in terms of absolute value, turns out to be all the higher, the higher the incident light intensity. The sum of all incident light sources can be formed, for example, by scattered light—guided internally in the organic optoelectronic component—of the light emitted by the at least one organic light emitting element during operation, by externally reflected light, by light of other light sources and combinations thereof. The electrically measurable signal of the at least one organic light detecting element can be processed further in an electronic circuit which can be formed by an external electronic component or which can form a part of the organic optoelectronic component as a monolithic element. By means of the electronic circuit, the organic light emitting element can in turn be controlled such that the luminous intensity at the location of the at least one organic light detecting element can be kept constant. The area of the at least one organic light detecting element can be adapted such that a sufficiently stable electrical signal can be generated during operation, without an instability of the light source, that is to say of the at least one organic light emitting element, being brought about on account of unstable feedback.

In the case of the organic optoelectronic component described here, it may advantageously be possible to achieve an exact automatic readjustment of the emitted light intensity of the organic light emitting element without an external sensor, which can considerably reduce in particular the circuitry outlay in comparison with known solutions. In particular, the light emitting diode is kept constant automatically at the light originating location independently of ageing properties of the light source even under variable ambient conditions, wherein it is possible to make use of the fact, for example, that the at least one organic light detecting element ages significantly more slowly than the at least one organic light emitting element, since, in particular, the organic materials of the at least one organic light detecting element are subjected to less loading, in particular less thermal loading.

In accordance with a further embodiment, the at least one organic light detecting element is designed to detect ambient light. Here and hereinafter, "ambient light" denotes light which can impinge from outside on the at least one organic light detecting element, that is to say which is not guided within the organic optoelectronic component by means of internal scattering or light guiding effects from the at least one organic light emitting element to the at least one organic light detecting element.

By way of example, the at least one organic light detecting element can be designed to detect ambient light through the common substrate. In this case, the common substrate is particularly preferably embodied as transparent and can comprise, for example, glass and/or a transparent plastic or be composed thereof. By way of example, the common substrate can be embodied in the form of a glass plate or glass layer or else in the form of a plastic plate, plastic layer or plastic film or else in the form of a glass-plastic laminate comprising at least one glass layer and at least one plastic layer.

If the at least one organic light detecting element has an electrode between the at least one organic light detecting layer and the common substrate, then said electrode, in the case of ambient light detection through the substrate, is likewise embodied as transparent or has at least one light-transmissive region. This can also mean that the electrode is embodied as a ring contact, for example. Here and hereinafter, "ring contact" denotes any form of an electrode which has an opening enclosed completely or only partly by electrode material in a lateral direction. In particular, a U-shaped electrode, for example, can also come under the term ring contact.

In accordance with at least one further embodiment, the at least one organic light detecting element is designed to detect ambient light which is radiated onto the organic optoelectronic component from the opposite side of the organic optoelectronic component relative to the substrate. In this case, the common substrate, depending on the emission direction of the organic light emitting element, can be embodied as transparent, non-transparent at least in the region of the organic light detecting element or else completely non-transparent. If the at least one organic light detecting element has an electrode on that side of the organic light detecting layer which faces away from the substrate, then said electrode is preferably embodied as transparent or as a ring contact. If the organic optoelectronic component has an encapsulation and/or a cover on the side facing away from the common substrate at least in the region of the organic light detecting element, then said encapsulation and/or said cover are/is likewise embodied as transparent in this case.

In accordance with a further embodiment, the at least one organic light emitting element is designed to emit light on an emission side of the organic optoelectronic component. An emission side, which denotes that side or those sides on which the organic optoelectronic component emits light, can be formed, for example, by the side on which the common substrate is arranged as viewed from the at least one organic light emitting layer of the at least one organic light emitting element. In this case, in which the common substrate is preferably embodied as transparent, the at least one organic light emitting element as well as the organic optoelectronic component can be designated as a so-called bottom emitter. Furthermore, it is also possible for an emission side to be arranged on the opposite side of the organic optoelectronic component relative to the common substrate, as viewed from the at least one organic light emitting layer. In this case, the at least one organic light emitting element and also the organic optoelectronic component can be embodied as a so-called top emitter. If the organic optoelectronic component is embodied simultaneously as a bottom and top emitter, it can preferably be embodied as a transparent organic optoelectronic component having two emission sides.

In accordance with a further embodiment, the at least one organic light detecting element is designed to detect ambient light which is radiated onto the organic optoelectronic component on a different side than an emission side of the organic optoelectronic component, such that an emission side of the organic optoelectronic component and a detection side of the at least one organic light detecting element are different. If the organic optoelectronic component emits, for example, in the direction facing away from the common substrate, that is to say if the organic optoelectronic component has a top emitter configuration, this means that the at least one organic light detecting element can detect ambient light through the common substrate. By contrast, if the organic optoelectronic component is embodied as a bottom emitter, this means that the at least one organic light detecting element is designed to detect ambient light from the opposite side of the organic optoelectronic component relative to the substrate.

In accordance with a further embodiment, the organic light detecting element is designed to detect ambient light which is radiated onto the organic optoelectronic component on the emission side. In other words, a detection side of the at least one organic light detecting element in this case corresponds to an emission side of the at least one organic light emitting element.

In accordance with a further embodiment, the organic optoelectronic component comprises a plurality of organic light detecting elements. This means that a plurality of organic light detecting elements are arranged on the common substrate. In particular, the plurality of the organic light detecting elements and the at least one organic light emitting element are arranged on the same side of the common substrate. By means of a plurality of organic light detecting elements, ambient light can be detected, for example, at different positions of the organic optoelectronic component. Furthermore, it is also possible that, with different organic light detecting elements, ambient light can be detected from different sides of the organic optoelectronic component.

In accordance with a further embodiment, at least one of the plurality of organic light detecting elements is designed to detect ambient light through the substrate, while at least another of the plurality of organic light detecting elements is designed to detect ambient light from the opposite side of the organic optoelectronic component relative to the substrate. In other words, at least two organic light detecting elements are present, which can detect ambient light from different sides of the organic optoelectronic component independently of one another. In particular, at least two of the plurality of light detecting elements can have different detection sides for the detection of ambient light.

Furthermore, it may also be possible that, for example, one organic light detecting element is provided which detects ambient light only on one side of the organic optoelectronic component, that is to say, for example, on the emission side or the opposite side relative to the emission side, and is thus embodied in a manner providing detection on one side, while a further organic light detecting element can detect ambient light on both sides of the organic optoelectronic component and is thus embodied in a manner providing detection on both sides.

In accordance with a further embodiment, a plurality of organic light emitting elements are arranged on the common substrate. In particular, the plurality of the organic light emitting elements and the at least one organic light detecting element or else a plurality of organic light detecting elements are all arranged on the same side of the common substrate. The organic light emitting elements of the plurality of organic light emitting elements can be regulatable, for example, separately from one another, such that the individual organic light emitting elements can be enabled to be switched on or off independently of one another, for example. Furthermore, each of at least two of the plurality of organic light emitting elements can be assigned in each case at least one organic light detecting element in relation to the control. As a result, it may be possible for the luminous area of the organic optoelectronic component, said luminous area being formed by the totality of the organic light emitting elements, to be subdivided into functional regions which are formed by the organic light emitting elements and which can be regulated independently of one another and can be controlled with regard to the respectively emitted light power with the aid of the organic light detecting elements.

The fact that an organic light emitting element is assigned an organic light detecting element means, in particular, that the light detecting element and the light emitting element form a functional unit with regard to the brightness regulation of the light emitting element. Furthermore, it can also mean that the organic light detecting element is closest to the assigned organic light emitting element in comparison with further organic light emitting elements.

In accordance with at least one further embodiment, the organic optoelectronic component comprises an encapsulation on the at least one organic light emitting element and/or on the at least one organic light detecting element. The encapsulation can be formed, for example, by a so-called thin-film encapsulation comprising at least one or a plurality of thin layers applied by means of a deposition method, preferably by means of a chemical vapor deposition method and/or an atomic layer deposition method, on the organic light emitting element and/or on the organic light detecting element. Alternatively or additionally, the encapsulation can, for example, also comprise a glass lid that is adhesively bonded above the at least one organic light emitting element and/or above the at least one organic light detecting element on the common substrate. Furthermore, the encapsulation can also comprise a cavity encapsulation, that is to say a lid with a depression above the organic elements, which is applied by means of adhesive bonding, soldering, glass soldering, bonding or some other suitable method.

In accordance with a further embodiment, the at least one organic light emitting element and the at least one organic light detecting element are encapsulated with a common encapsulation. In other words, this means that an encapsulation is applied on the organic light emitting element and the organic light detecting element, which encapsulation extends continuously at least over both elements. Furthermore, between the at least one organic light emitting element and the at least one organic light detecting element, it is possible to arrange an electrical insulator layer directly on the substrate, said electrical insulator layer being covered by the common encapsulation. The electrical insulator layer directly on the substrate can be provided in particular for electrically insulating the organic light emitting element electrically from the organic light detecting element and/or for optically isolating it therefrom.

As an alternative thereto, it may also be possible for there to be no electrical insulator layer present between the at least one organic light emitting element and the at least one organic light detecting element. In the case of a common encapsulation, in particular a common thin-film encapsulation, this can mean that, between the at least one organic light emitting element and the at least one organic light detecting element, the encapsulation is arranged directly on the substrate and is thus in direct contact with the common substrate between the two elements.

In accordance with a further embodiment, the at least one organic light emitting element is encapsulated with a first encapsulation and the at least one organic light detecting element is encapsulated with a second encapsulation, which is applied separately from the first encapsulation. That can mean, in particular, that an interspace between the at least one organic light emitting element and the at least one organic light detecting element is free of an encapsulation. Furthermore, an electrical insulator layer can be arranged between the at least one organic light emitting element and the at least one organic light detecting element, said electrical insulator layer being arranged between the first and second encapsulations as viewed in a lateral direction. In other words, this can mean that the electrical insulator layer, which is preferably provided for the electrical insulation and/or optical isolation of the organic light emitting element from the organic light detecting element, is not covered by any encapsulation and is therefore free of encapsulation material.

In accordance with a further embodiment, a coupling-out layer is arranged on the emission side of the organic optoelectronic component, said coupling-out layer being embodied as a scattering layer, for example, and facilitating light coupling-out of the light generated in the at least one organic light emitting element from the organic optoelectronic component. The coupling-out layer can be arranged, for example, on that side of the substrate which faces away from the organic light emitting element and the organic light detecting element. Alternatively or additionally, a coupling-out layer can also be arranged as an internal scattering layer or coupling-out layer between the common substrate and the organic light emitting element. Furthermore, it may also be possible for a coupling-out layer additionally or alternatively to be arranged on the opposite side of the organic light emitting element relative to the substrate.

The organic optoelectronic component described here, in comparison with conventional organic surface emitters, can be producible without considerable additional complexity and without considerable additional costs preferably by means of an unchanged process implementation during production. As a result of the integration of the at least one organic light detecting element on the common substrate together with the at least one organic light emitting element, by means of a suitable regulation during operation, the radiation power of the at least one organic light emitting element, which can be embodied in particular as a surface lighting element, can be accurately adapted to external conditions, which can lead to an energy saving, for example, during operation. In particular, a constant illumination power is possible at the location of the at least one organic light emitting element and/or at the location of the at least one organic light detecting element. By means of an automated electronic circuit, which can be embodied as a monolithic electronic component or as an external electronic component with a current and/or voltage source, which can control the at least one organic light emitting element by means of the electrical signal generated by the at least one organic light detecting element, an efficient readjustment of the illumination may be possible.

Measurements with test set-ups which comprised an organic light emitting element having a luminous area of approximately 2 cm$^2$, an operating voltage of 6.5 V and a luminance of approximately 2500 cd/m$^2$ showed, as a result of a variation of the areas of an organic light emitting element and of an organic light detecting element and as a result of variation of the distance and the lateral offset between the organic light emitting element and the organic light detecting element, that in the case of an organic photodiode as organic light detecting element the photovoltage is all the greater, the larger the area of the organic light detecting element, while the photovoltage is all the lower, the greater the distance and the greater the offset between the organic light emitting element and the organic light detecting element. Typical distances between the organic light emitting element and the organic light detecting element were in the range of from 5 mm to 75 mm, for example, 5 mm, 20 mm and 75 mm, and a typical detector size for the organic light detecting element had a diameter of approximately 4 mm.

BRIEF DESCRIPTION OF THE DRAWINGS

Further advantages, advantageous embodiments and developments will become apparent from the exemplary embodiments described below in association with the figures.

In the figures.

In the exemplary embodiments and figures, elements that are identical, of identical type or act identically may be provided in each case with the same reference signs. The illustrated elements and their size relationships among one another should not be regarded as true to scale; rather, individual elements such as, for example, layers, component parts, components and regions may be illustrated with an exaggerated size in order to enable better illustration and/or in order to afford a better understanding.

DETAILED DESCRIPTION OF ILLUSTRATIVE EMBODIMENTS

Figure 1:
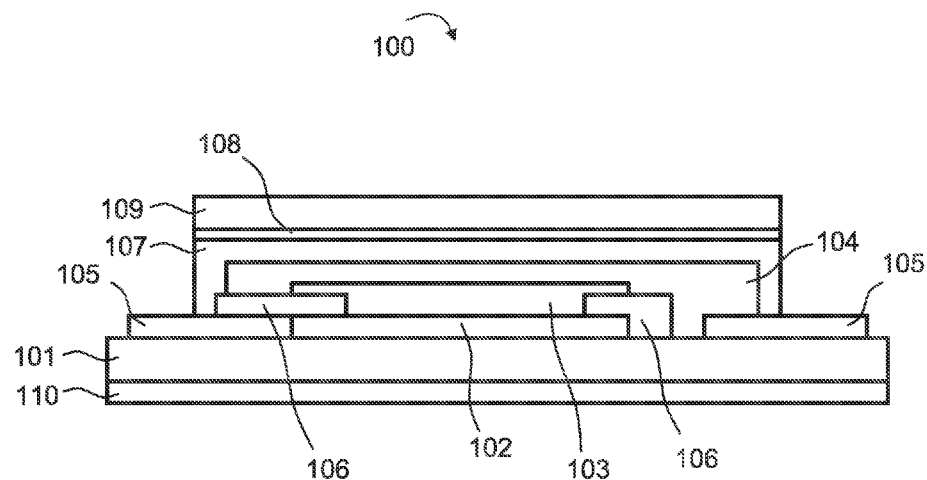
FIG. 1 shows a schematic illustration of an organic light emitting element in accordance with one exemplary embodiment.

FIG. 1 shows in accordance with an embodiment the basic construction of an organic light emitting element 100 embodied as an organic light emitting diode (OLED).

The organic light emitting element 100, which may also be designated as OLED 100 hereinafter, comprises a substrate 101, on which an organic functional layer stack 103 having at least one organic light emitting layer is arranged between electrodes 102 and 104. At least one of the electrodes 102, 104 is embodied as transparent, such that light generated in the organic functional layer stack 103 during the operation of the OLED 100 can be radiated through the at least one transparent electrode.

In the OLED 100 shown in FIG. 1, the substrate 101 is embodied as transparent, for example, in the form of a glass plate or glass layer. As an alternative thereto, the substrate 101 can, for example, also comprise a transparent plastic or a glass-plastic laminate.

The electrode 102 applied on the substrate 101 is likewise embodied as transparent and comprises a transparent conductive oxide, for example. Transparent conductive oxides (TCO) are transparent conductive materials, generally metal oxides, such as, for example, zinc oxide, tin oxide, cadmium oxide, titanium oxide, indium oxide and indium tin oxide (ITO). Alongside binary metal-oxygen compounds, such as, for example, $ZnO$, $SnO_2$ or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides, also belong to the group of TCOs. Furthermore, the TCOs do not necessarily correspond to a stoichiometric composition and can also be p- or n-doped. Furthermore, a transparent electrode can, for example, also comprise a transparent metal, metallic network structures or conductive networks, for example, comprising or composed of silver, and/or graphene or carbon-containing layers or a combination of the transparent materials mentioned.

In the exemplary embodiment shown, the further electrode 104 on the organic functional layer stack 103 is embodied as reflective and comprises a metal, which can be selected from aluminum, barium, indium, silver, gold, magnesium, calcium and lithium, and compounds, combinations and alloys therewith. In particular, the electrode 104 can comprise Ag, Al or alloys or layer stacks comprising these, for example, Ag/Mg, Ag/Ca, Mg/Al or Mo/Al/Mo or Cr/Al/Cr. Alternatively or additionally, the electrode 104 can also comprise an abovementioned TCO material or a layer stack comprising at least one TCO and at least one metal.

In the exemplary embodiment shown, the bottom electrode 102 is embodied as an anode, while the top electrode 104 is embodied as a cathode. With an appropriate choice of materials, however, a construction reversed with respect to the polarity is also possible.

The electrodes 102, 104 are preferably embodied in large-area and continuous fashion, such that the organic light emitting element 100 is shaped as a luminous source, in particular as a surface light source. In this case, "large-area" can mean that the organic light emitting element 100 has an area of greater than or equal to a few square millimeters, preferably greater than or equal to one square centimeter and particularly preferably greater than or equal to one square decimeter. As an alternative thereto, it may also be possible that at least one of the electrodes 102, 104 of the organic light emitting element 100 between which the organic functional layer stack 103 is situated is embodied in a structured fashion, as a result of which a spatially and/or temporally structured and/or variable luminous impression, for example, for structured lighting or for a display device, can be made possible by means of the organic light emitting element 100.

For electrically contacting the electrodes 102 and 104, as is shown in FIG. 1, electrode connection pieces 105 can also be provided, which extend through below the encapsulation 107 (described further below) from the electrodes 102, 104 toward the outside. The electrode connection pieces 105 embodied as electrical contact feeds, can be embodied as transparent or non-transparent depending on the emission direction of the OLED 100 and can comprise or be composed of a TCO and/or a metal, for example. By way of example, the electrode connection pieces 105 can be formed by a metal layer or a metal layer stack, for example, Mo/Al/Mo, Cr/Al/Cr or Al.

The organic functional layer stack 103 can comprise, in addition to the at least one organic light emitting layer, further organic layers, for example, one or more selected from a hole injection layer, a hole transport layer, an electron marking layer, a hole marking layer, an electron transport layer, an electron injection layer and a charge generation layer (CGL), which are suitable for conducting holes or electrons to the organic light emitting layer or for blocking the respective transport. The layers of the organic functional layer stack 103 can comprise organic polymers, organic oligomers, organic monomers, organic small, non-polymeric molecules ("small molecules"), or combinations thereof. In particular, it may be advantageous if the organic functional layer stack 103 comprises a functional layer embodied as a hole transport layer in order to enable an effective injection of holes into the organic light emitting layer. By way of example, tertiary amines, carbazole derivatives, conductive polyaniline or polyethylene dioxythiophene may prove to be advantageous as materials for a hole transport layer. Suitable materials for the light emitting layer include electroluminescent materials which exhibit radiation emission on account of fluorescence or phosphorescence, for example, polyfluorene, polythiophene or polyphenylene or derivatives, compounds, mixtures or copolymers thereof.

Furthermore, as shown in FIG. 1, insulator layers 106 can be present, for example, comprising or composed of polyimide, which insulator layers can electrically insulate the electrodes 102, 104 from one another, for example. Depending on the configuration of the individual layers of the OLED 100, insulator layers 106 moreover need not be absolutely necessary and may be absent, for instance in the case of corresponding mask processes for applying the layers.

An encapsulation 107 for protecting the organic functional layer stack 103 and the electrodes 102, 104 is arranged above the organic functional layer stack 103 and the electrodes 102, 104. In this case, the encapsulation 107 is particularly preferably embodied as a thin-film encapsulation.

In the present case, an encapsulation embodied as a thin-film encapsulation is understood to mean a device suitable for forming a barrier with respect to atmospheric substances, in particular with respect to moisture and oxygen and/or with respect to further damaging substances such as, for instance, corrosive gases, for example, hydrogen sulfide. In other words, the thin-film encapsulation is embodied in such a way that at most very small portions of atmospheric substances can penetrate through it. This barrier effect in the case of the thin-film encapsulation is substantially produced by barrier layers and/or passivation layers which are embodied as thin layers and which are part of the encapsulation. The layers of the encapsulation generally have a thickness of less than or equal to a few 100 nm.

In particular, the thin-film encapsulation can comprise or consist of thin layers which are responsible for the barrier effect of the encapsulation. The thin layers can be applied, for example, by means of an atomic layer deposition (ALD) method or molecular layer deposition (MLD) method. Suitable materials for the layers of the encapsulation arrangement are, for example, aluminum oxide, zinc oxide, zirconium oxide, titanium oxide, hafnium oxide, lanthanum oxide, tantalum oxide. The encapsulation preferably comprises a layer sequence having a plurality of the thin layers, each having a thickness of between one atomic layer and a few 100 nm.

As an alternative or in addition to thin layers produced by means of ALD or MLD, the encapsulation can comprise at least one or a plurality of further layers, that is to say in particular barrier layers and/or passivation layers, which are deposited by thermal vapor deposition or by means of a plasma-assisted process, for instance sputtering, chemical vapor deposition (CVD) or plasma-enhanced chemical vapor deposition (PECVD). Suitable materials therefor may be the abovementioned materials and silicon nitride, silicon oxide, silicon oxynitride, indium tin oxide, indium zinc oxide, aluminum-doped zinc oxide, aluminum oxide, and mixtures and alloys of the materials mentioned. The one or the plurality of further layers can have, for example, in each case a thickness of between 1 nm and 5 µm and preferably between 1 nm and 400 nm, inclusive of the limits.

As an alternative or in addition to a thin-film encapsulation, the encapsulation 107 can also comprise a glass lid which, for example, in the form of a glass substrate having a cavity, is adhesively bonded on the substrate 101 by means of an adhesive layer. Furthermore, a moisture-absorbing substance (getter), for example, composed of zeolite, can be adhesively bonded into the cavity in order to bind moisture, oxygen or other damaging gases which can penetrate through the adhesive. Furthermore, the adhesive layer for fixing the lid on the substrate may also itself be absorbent for damaging substances and/or adhesive layer structures may be present.

Furthermore, as shown in FIG. 1, a cover 109 adhesively bonded by means of an adhesive layer 108 can be arranged on the encapsulation 107, as viewed from the substrate 101. The cover 109, which can also be designated as "superstrate" in view of its arrangement in comparison with the substrate 101, can be formed, for example, by a glass layer or glass plate or else a plastic, a metal or a combination or a laminate of the materials mentioned and, in particular in conjunction with an encapsulation 107 embodied as a thin-film encapsulation, can serve as mechanical protection, in particular as anti-scratch protection, without the cover 109 itself having to have an encapsulating effect. Alternatively or additionally, a protective lacquer, for example, in the form of a spray lacquer, can also be applied on the encapsulation 107.

On account of the transparent substrate 101 and the transport bottom electrode 102, the OLED 100 is embodied as a so-called bottom emitter and emits light through the transparent electrode 102 and the transparent substrate 101 during operation. In order to improve the coupling out of light, as shown in FIG. 1, an optical coupling-out layer 110 can be arranged on that side of the substrate 101 which faces away from the organic functional layer stack 103, said optical coupling-out layer being embodied, for example, as a scattering layer comprising scattering particles in a transparent matrix and/or having a light-scattering surface structure. It is also possible to arrange a coupling-out layer, for example, between the substrate 101 and the bottom electrode 102 arranged on the substrate 101 or between other functional layers in the form of an internal coupling-out layer.

As an alternative to the bottom emitter configuration described, the top electrode 104 arranged in a manner facing away from the substrate 101 can also be embodied as transparent, in order that the light generated in the organic functional layer stack 103 during operation is emitted through the top electrode 104 in a direction facing away from the substrate 101. In this case, the OLED 100 is embodied as a so-called top emitter. The bottom electrode 102 arranged between the substrate 101 and the organic functional layer stack 103 can also be embodied as reflective, if light emission through the substrate 101 is not desired. Likewise, in this case, the substrate 101 can comprise a non-transparent material, for example, a non-transparent glass, a non-transparent plastic, a metal or combinations thereof. In addition to the top electrode 104, in the top emitter configuration the encapsulation 107 and, if present, also the adhesive layer 108 and the cover 109 are also embodied as transparent. Furthermore, in this case, a coupling-out layer can be arranged above the top electrode 104, for example, on the cover 109 or between the cover 109 and the encapsulation 107.

Furthermore, the OLED 100 can also be embodied simultaneously as a bottom emitter and as a top emitter and thus preferably as a transparent OLED and can have a combination of the features respectively mentioned in association with the bottom and top emitter configurations.

With regard to further features of the organic light emitting element 100, for example, with regard to the construction, the layer composition and the materials of the organic functional layer stack, of the electrodes and of the encapsulation, reference is made to International Application Publication No. WO 2010/066245 A1, which is hereby expressly incorporated by reference with regard to the construction of an organic light emitting component and also with regard to modifications and variations of the organic light emitting element shown in FIG. 1.

The exemplary embodiments shown hereinafter have in each case an organic light emitting element 100 which may be embodied in accordance with the exemplary embodiment in FIG. 1 or which may have modifications or variations with respect thereto. In particular, the features of the basic construction of the organic light emitting element 100 as shown in FIG. 1 should not be understood to be restrictive for the following exemplary embodiments.

Figure 2A:
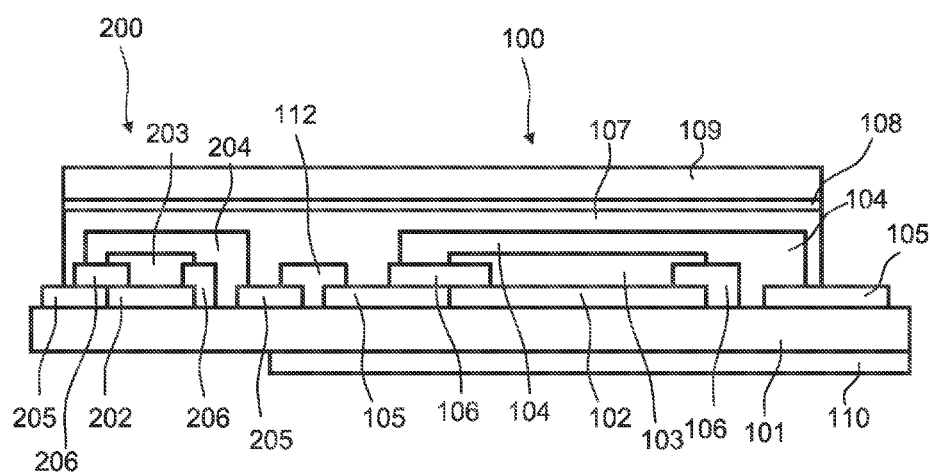
FIGS. 2A and 2B show schematic illustrations of an organic optoelectronic component and of the light relationships in the case of an organic optoelectronic component in accordance with further exemplary embodiments.

FIG. 2A shows an organic optoelectronic component in accordance with one exemplary embodiment, comprising alongside an organic light emitting element 100 an organic light detecting element 200. The organic light detecting element 200 is arranged together with the organic light emitting element 100 on the substrate 101, such that the substrate 101 forms a common substrate for the organic light emitting element 100 and the organic light detecting element 200. In particular, the organic light emitting element 100 and the organic light detecting element 200 are arranged on the same side of the common substrate 101 in laterally adjacent area regions. As a result, the organic light emitting element 100 and the organic light detecting element 200 are applied in one and the same plane and in direct contact with the substrate 101 on the latter.

In the exemplary embodiment shown, the organic light detecting element 200 is embodied and useable as organic photodiode. The organic light detecting element 200 comprises an organic functional layer stack 203 between two electrodes 202, 204, wherein the organic functional layer stack 203 has at least one organic light detecting layer. In the exemplary embodiment shown, the at least one organic light detecting layer is embodied as a pn junction for generating charge carriers.

In particular, the organic light detecting element 200, in the exemplary embodiment shown, with regard to the electrodes 202, 204 and the organic functional layer stack 203, have the same construction as the organic light emitting element 100 with regard to the electrodes 102, 104 and the organic functional layer stack 103 and can be operated inversely with respect to the organic light emitting element 100, that is to say with opposite electrical polarity. As a result, the manufacture of the organic optoelectronic component shown may cause no or only low additional costs in comparison with an exclusively light emitting component. As an alternative thereto, the organic light detecting element 200, in comparison with the organic light emitting element 100, may comprise different materials and/or different layer constructions with regard to the electrodes 202, 204 and/or the organic functional layer stack 203.

The organic optoelectronic component furthermore comprises an encapsulation 107, which is embodied as a thin-film encapsulation and which forms a common encapsulation for the organic light emitting element 100 and the organic light detecting element 200. In other words, the encapsulation 107 extends with large area and continuously over the functional layers of the organic light emitting element 100 and of the organic light detecting element 200. A common cover 109 is fixed on the common encapsulation 107 by means of an adhesive layer 108.

Furthermore, electrode connection pieces 205 are present, which serve for electrically contacting the electrodes 202, 204 and which can be embodied like the electrode connection pieces 105 of the organic light emitting element 100. The electrode connection pieces 105, 205 extend from the elements 100, 200 out of the encapsulation 107, such that the elements 100, 200 can be contacted externally.

An electrical insulator layer 112 is arranged between the organic light emitting 100 and the organic light detecting element 200 directly on the substrate 101, said electrical insulator layer being covered by the common encapsulation 107. The electrical insulator layer 112, which can comprise or be composed of polyimide or some other electrically insulating material, for example, serves for electrically insulating the organic light detecting element 200 from the organic light emitting element 100, such that the electrode connection pieces 105, 205 of the elements 100, 200 can also be arranged at a small distance from one another on the common substrate 101, without the occurrence of an electrical crosstalk between the elements 100, 200.

Figure 2B:
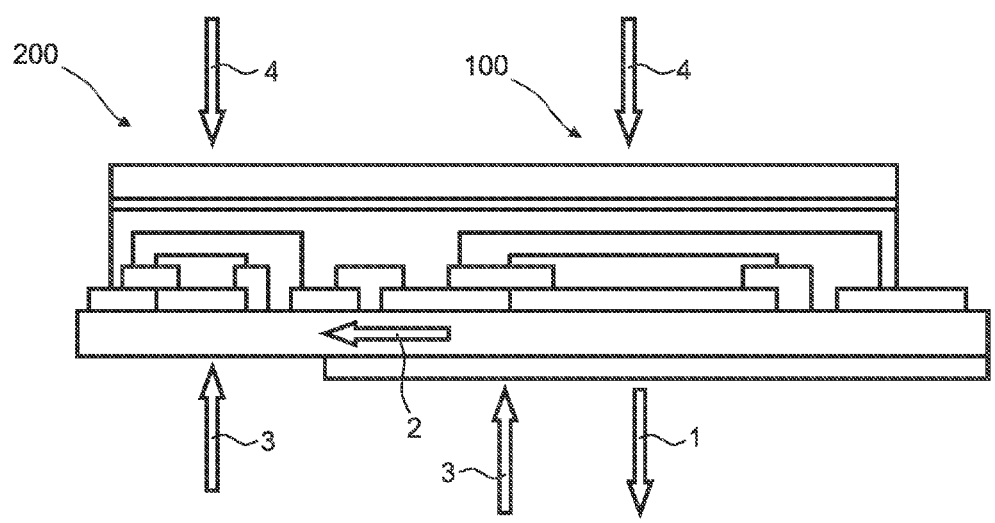

FIG. 2B indicates the light relationships during operation for the organic optoelectronic component from FIG. 2A. In FIG. 2B and also in the subsequent figures, the reference signs of the individual layers and parts of the organic optoelectronic component respectively shown are depicted principally only with regard to differences with respect to the previously described exemplary embodiments, for the sake of clarity.

The organic light emitting element 100 in FIGS. 2A and 2B and thus the organic optoelectronic component shown, in the exemplary embodiment shown, is embodied purely by way of example as a bottom emitter and during operation emits light 1 through the common substrate and the electrode embodied as transparent that is arranged between the organic functional layer stack and the common substrate. The substrate side of the organic optoelectronic component thus forms the emission side. Through the transparent substrate, part of the light generated by the organic light emitting element 100 can also be guided to the organic light detecting element 200 on account of scattering and waveguiding effects, as indicated by the reference sign 2. Furthermore, depending on the embodiment of the electrodes and insulator layers, light may possibly also pass through the common encapsulation from the organic light emitting element 100 to the organic light detecting element 200. By means of a targeted adaptation of the distance between the organic light emitting element 100 and the organic light detecting element 200 and in this case in particular with regard to an absorption in the common substrate, by means of a suitable arrangement of one or a plurality of coupling-out layers on one or both sides of the common substrate, by means of a suitable choice of materials with regard to the electrodes, the insulator layers and the encapsulation, for example, with regard to a suitable refractive index for avoiding total internal reflection in the substrate or the cover, and by means of suitable substrate materials which are non-transparent at least in places, in particular, for example, in the case of an embodiment of the organic light emitting element 100 as a top emitter, the light 2 guided internally from the organic light emitting element 100 to the organic light detecting element 200 can be reduced or completely suppressed. A complete suppression or at least a greatest possible reduction of the internally guided light 2 may be desirable and advantageous in particular if the intention is for only ambient light, that is to say external light, to be detected by the organic light detecting element 200. The ambient light can be radiated onto the organic optoelectronic component and thus also onto the organic light detecting element 200 on the substrate side, indicated by the reference signs 3, and/or on the side of the cover, indicated by the reference signs 4, depending on the arrangement and embodiment of the organic optoelectronic component. The ambient light 3, 4 can be, for example, light from other natural or artificial light sources or else light 1 from the organic optoelectronic component which is reflected back onto the organic light detecting element 200 by external reflection. The light 3, 4 incident on the organic light detecting element 200 on the front or rear side, that is to say on the substrate side or the cover side of the organic optoelectronic component and thus on the emission side or the opposite side relative to the emission side, can be influenced by the choice of the materials lying between the surroundings and the organic functional layer stack of the organic light detecting element 200. By way of example, by means of an arrangement of a coupling-out layer also on a side of the organic light detecting element 200, it is possible to influence the coupling of ambient light 3, 4 into the organic light detecting element 200.

The following exemplary embodiments show variations and modifications of the organic optoelectronic component in accordance with the exemplary embodiment in FIGS. 2A and 2B which exhibit, inter alia, variation possibilities in terms of construction and for light detection. By way of example, it is possible to vary the type of the organic light detecting element with regard to the construction and the functioning and/or the electrical circuitry, the number of organic light detecting elements, the position of one or more organic light detecting elements in relation to the luminous area of the organic light emitting element, the detection area of the organic light detecting element, for example, in relation to an adaptation to the organic light emitting element in terms of geometry, stack and/or circuitry, the distance between the organic light detecting element and the organic light emitting element, the arrangement and number of one or more coupling-out layers and/or the waveguide properties in the substrate or the rest of the layer structure and thus the signal transmission between the organic light emitting element and the organic light detecting element.

Figure 3:
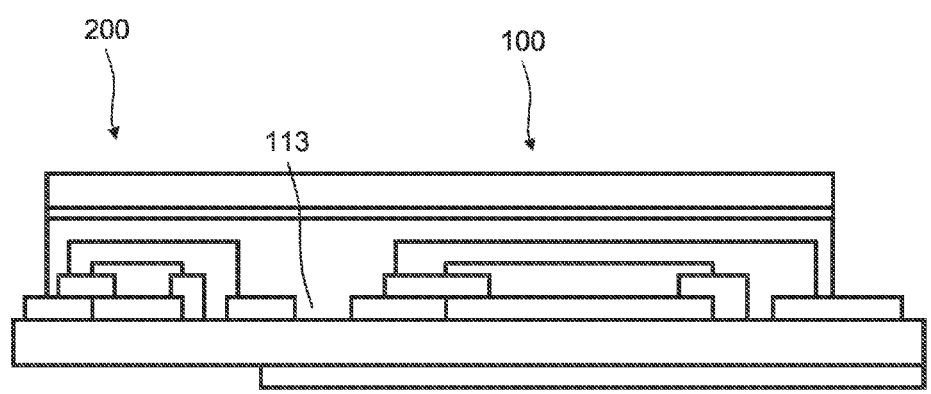
FIGS. 3 to 12 show schematic illustrations of organic optoelectronic components in accordance with further exemplary embodiments.

FIG. 3 shows an organic optoelectronic component having, in comparison with the exemplary embodiment in FIGS. 2A and 2B, between the organic light emitting element 100 and the organic light detecting element 200 an interspace 113 instead of an electrical insulator layer 112. In the exemplary embodiment shown, the common encapsulation extends between the elements 100, 200 as far as the common substrate. As a result, by way of example, it is possible to influence the light guiding of internally guided light between the organic light emitting element 100 and the organic light detecting element 200.

Figure 4A:
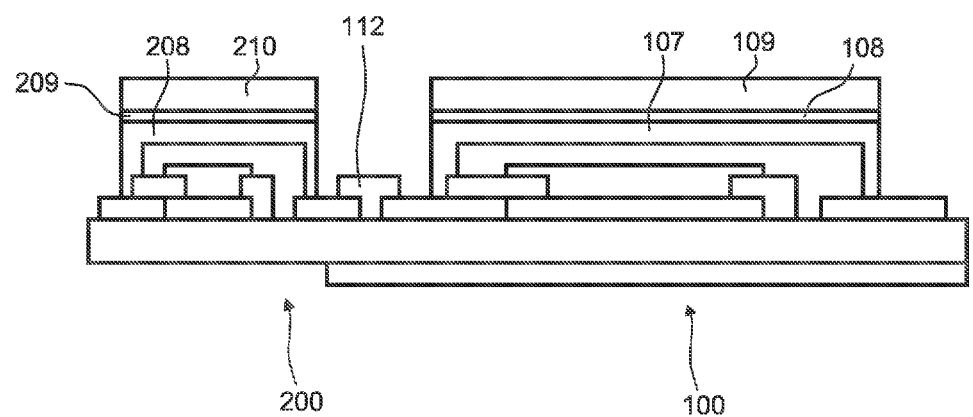

FIG. 4A shows one exemplary embodiment of an organic optoelectronic component which, purely by way of example, in comparison with the exemplary embodiment in accordance with FIGS. 2A and 2B, does not have a common encapsulation with a common cover. In particular, the organic light emitting element 100 has a first encapsulation 107, while the organic light detecting element 200 has a second encapsulation 208, which is applied separately from the first encapsulation 107, such that the organic light emitting element 100 and the organic light detecting element 200 are encapsulated independently of one another. As shown in FIG. 3A, an electrical insulator layer 112 not covered by any of the encapsulations 107, 208 can be provided between the organic light emitting element 100 and the organic light detecting element 200.

The encapsulations 107, 208 can be embodied identically or differently and can be adapted to the respective requirements of the organic light emitting element 100 and of the organic light detecting element 200 in particular in terms of the choice of materials, the optical properties and the encapsulation properties. In each case a cover 109, 210 is applied on the encapsulations 107, 208 by means of a respective adhesive layer 108, 209, which cover can be embodied, for example, like the common cover 109 in accordance with the previous exemplary embodiments.

Figure 4B:
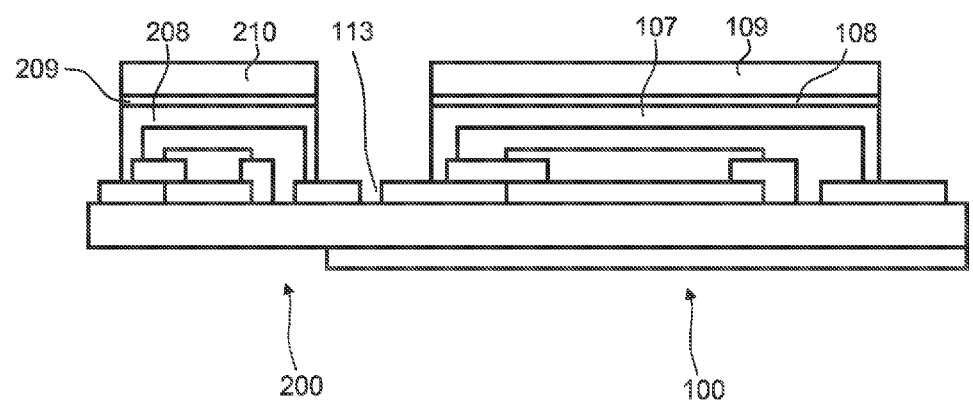

FIG. 4B shows a further exemplary embodiment of an organic optoelectronic component which, in comparison with the previous exemplary embodiment, does not have an electrical insulator layer 112 between the organic light emitting element 100 and the organic light detecting element 200, but rather an interspace 113.

By means of a separate encapsulation 107, 208 for the organic light emitting element 100 and the organic light detecting element 200, it is possible, for example, to influence the light which is directly radiated from the organic light emitting element 100 onto the organic light detecting element 200 by scattering and/or waveguiding. Furthermore, the elements 100, 200 can be electrically contacted in the interspace between the encapsulations 107, 208, as is shown further below in connection with FIGS. 17 and 18.

The organic optoelectronic components described in association with the following exemplary embodiments can also comprise separate encapsulations 107, 208 for the elements 100, 200 instead of the continuous common encapsulation 107 shown there.

Figure 5:
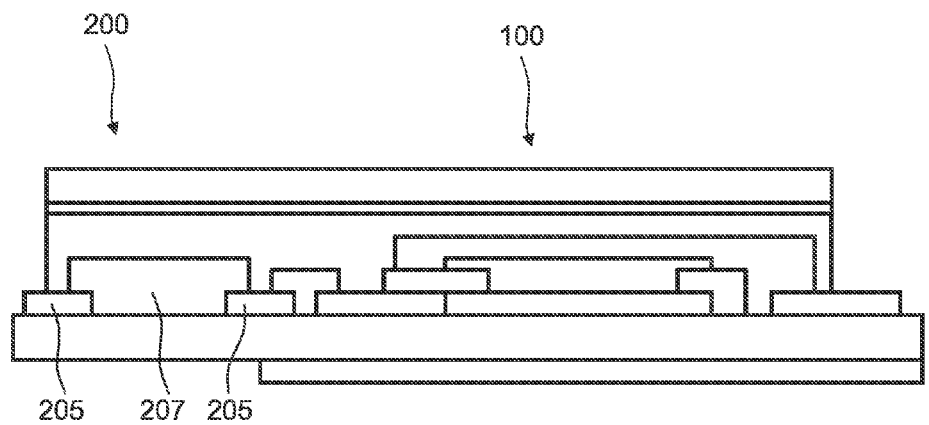

FIG. 5 shows a further exemplary embodiment of an organic optoelectronic component comprising, in comparison with the previous exemplary embodiments, instead of an organic light detecting component 200 embodied as organic photodiode, an organic light detecting element 200 embodied as an organic photoconductor comprising an organic photoconductive material 207 which generates electrical charges upon irradiation by light.

Photoconductive organic materials can be embodied in one layer on an electrically conductive layer, for example, as in the exemplary embodiment shown, for example, on an electrode or on the electrode connection pieces 205 shown in FIG. 5 also without an additional electrode. By way of example, the organic photoconductive material 207 can be based on a PVK-TNF charge transfer complex (PVK: polyvinylcarbazole, TNF: 2,4,7-trinitro-9-fluorenone). Furthermore, the organic photoconductive material 207 can, for example, also be embodied in two layers in the form of an organic charge generation layer and an organic layer that transports charge carriers. Examples of organic materials that generate charge carriers include (di)azo dyes, squaraine derivatives and phthalocyanines, and examples of organic materials that conduct charge carriers include arylamines, oxadiazoles, TPD (N,N'-bis(3-methylphenyl)-N,N'-bis(phenyl)-benzidine) and NPB (N,N'-bis(naphthalene-1-yl)-N,N'-bis(phenyl)-benzidine). Furthermore, an organic light detecting element 200 embodied as organic photoconductor can have the same construction as the organic light emitting element 100, wherein here it is possible to utilize the depletion layer properties of the at least one pn junction of the organic active layer in the functional layer stacks.

The organic light detecting element 200 embodied as an organic photoconductor can be irradiated with ambient light from both sides, that is to say through the substrate and through the encapsulation. In order to prevent ambient light, for example, from one side or internally guided light from being radiated onto the organic photoconductive material 207, non-transparent insulator layers, electrically insulated metal layers, non-transparent materials for the encapsulation and/or a non-transparent cover, for example, a non-transparent glass cover, can also be provided.

Depending on materials and construction of the organic light detecting element 200, the latter can also be constructed simultaneously as photoconductor and photodiode. Such an organic light detecting element 200 can be useable as a photodiode with an electrical bias voltage and as a photoconductor without an electrical bias voltage.

Furthermore, depending on materials and construction, the electrical resistance of the organic light detecting element 200 can also be measured, such that the organic light detecting element 200 can be embodied and usable as organic photoresistor. By way of example, the organic light detecting element 200 for this purpose can comprise an organic functional layer based on pentacene.

Figure 6:
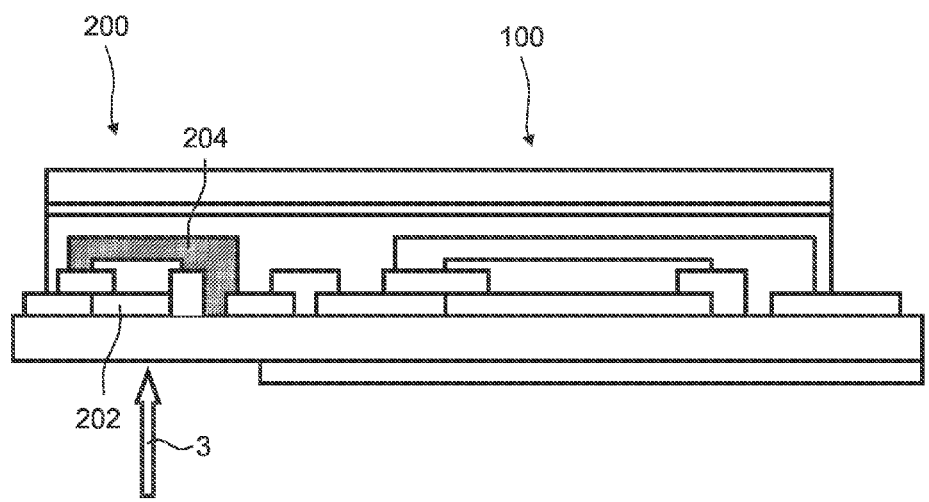
Figure 7:
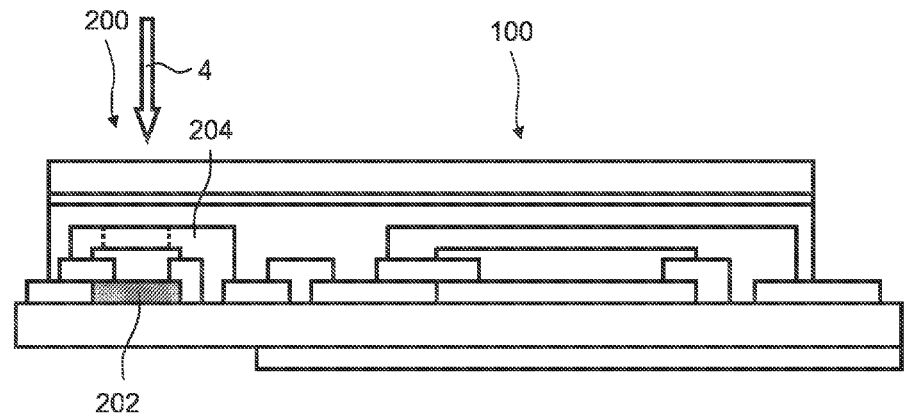
Figure 8:
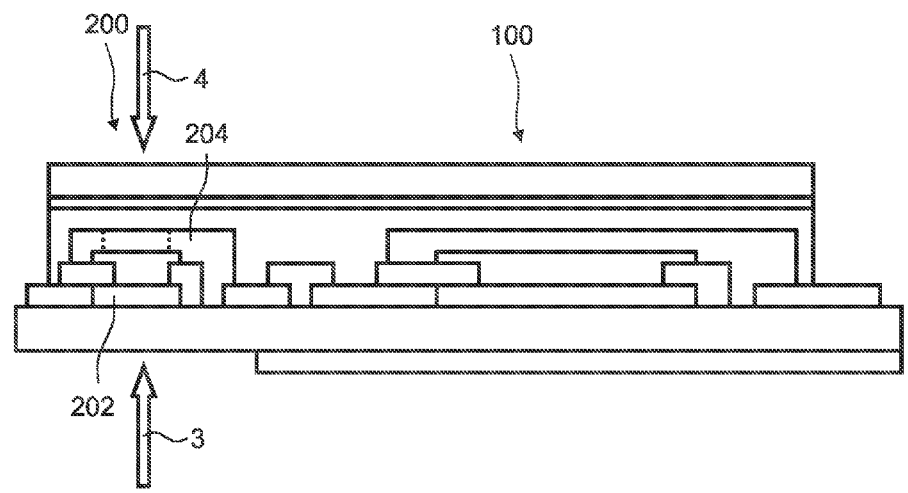

FIGS. 6 to 8 show various exemplary embodiments in which the different detection directions for an organic light detecting element 200 are elucidated again, said element being embodied purely by way of example as an organic photodiode as in the exemplary embodiment in FIGS. 2A and 2B. In these exemplary embodiments, the organic light emitting element 100 is embodied as a bottom emitter and emits light only through the common substrate. As an alternative thereto, the organic light emitting element 100 in the exemplary embodiments described below can, however, also be embodied as a top emitter, wherein here the side with the cover, that is to say the opposite side of the organic optoelectronic component relative to the substrate, forms the emission side. Furthermore, the organic light emitting element 100 can also be embodied as a transparent OLED which emits light on both sides.

In the exemplary embodiment in FIG. 6, the organic light detecting element 200 has a transparent electrode 202 on the emission side, that is to say on that side of the organic functional layer stack which faces the substrate, while the top electrode 204 arranged opposite is embodied as reflective or at least non-transparent, as indicated by the hatching. By way of example, the transparent electrode 202 can be formed by a TCO or a transparent metal, that is to say a sufficiently thin metal layer, or a combination and/or a plurality thereof, while the non-transparent electrode 204 can be formed, for example, by a non-transparent metal, that is to say a sufficiently thick metal layer. With regard to an organic light emitting element 100 embodied as a bottom emitter, the organic light detecting element 200 of the exemplary embodiment in FIG. 6 is therefore designed to detect ambient light 3 which is radiated onto the organic optoelectronic component on the emission side, such that the emission side of the organic optoelectronic component in the bottom emitter configuration or else in a transparent embodiment corresponds to the detection side of the organic light detecting element 200.

FIG. 7 shows one exemplary embodiment of an organic optoelectronic component in which, in contrast to the previous exemplary embodiment, the bottom electrode 202, that is to say the electrode arranged on the substrate side, is embodied as non-transparent and reflective, for example, as is indicated by the hatching, while the top electrode 204 arranged on the opposite side relative to the substrate is embodied as transparent or light-transmissive at least in partial regions, such that the organic light detecting element 200 in this exemplary embodiment is designed to detect ambient light 4 which is radiated onto the organic optoelectronic component from the opposite side relative to the substrate. The detection side of the organic light detecting element 200 thus differs from the emission side of the organic optoelectronic component in the bottom emitter configuration.

The top electrode 204 can comprise, for example, a transparent material such as a TCO, for instance. Alternatively or additionally, it may also be possible for the top electrode 204 to be embodied as a ring contact and to have, for example, an opening above the organic functional layer stack of the organic light detecting element 200, as is indicated by the dashed lines. Such an opening can be completely enclosed by electrode material in a lateral direction, such that the electrode 204 can be embodied as a complete ring. Furthermore, it is also possible for an electrode 204 embodied as a ring contact to enclose the opening only in a partial region in a lateral direction and thus to be embodied in a U-shaped fashion, for example.

FIG. 8 shows a further exemplary embodiment of an organic optoelectronic component in which both electrodes 202, 204 are embodied as transparent and/or as ring contact, such that the organic light detecting element 200 shown in FIG. 8 can detect ambient light 3, 4 which is radiated onto the organic optoelectronic component from both sides.

As an alternative to non-transparent electrode materials, it is also possible to use transparent electrode materials in combination with a non-transparent additional material, for example, a non-transparent insulator material, wherein the additional, non-transparent material can shade the organic material of the organic light detecting element from ambient light.

Figure 9:
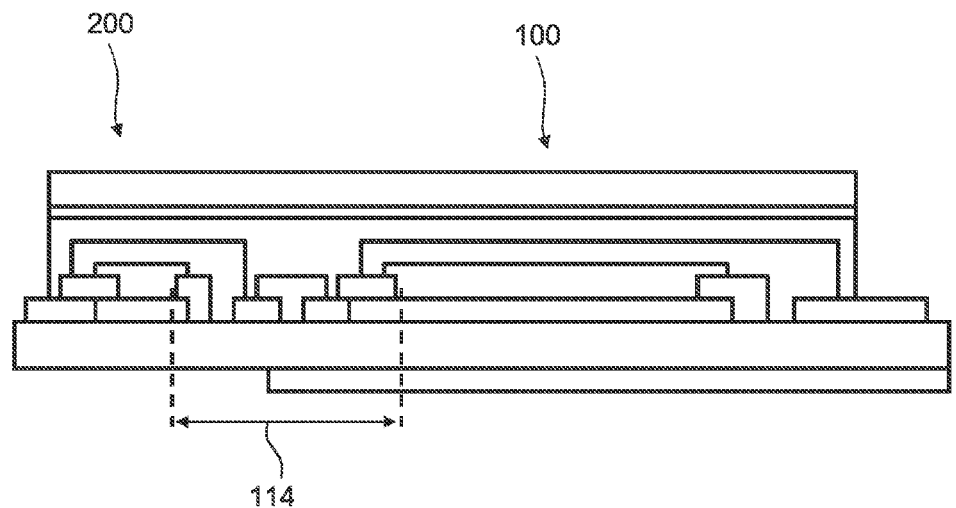

FIG. 9 shows a further exemplary embodiment in which the distance 114 between the organic light emitting element 100 and the organic light detecting element 200 is reduced in comparison with the previous exemplary embodiments. By means of a variation of the distance 114, for example, by means of the distance reduction shown or else an increase in the distance, it is possible, depending on the application, to influence the portion of the light guided internally from the organic light emitting element 100 to the organic light detecting element 200. By way of example, in the case of at least two organic light detecting elements 200 which are arranged directly alongside one another and are at different distances from the organic light emitting element 100, assuming identical external illumination of the organic optoelectronic component and in particular of the organic light detecting elements 200, a differentiation of the internal and external illumination of the organic light detecting elements 200 can be measurable.

Figure 10:
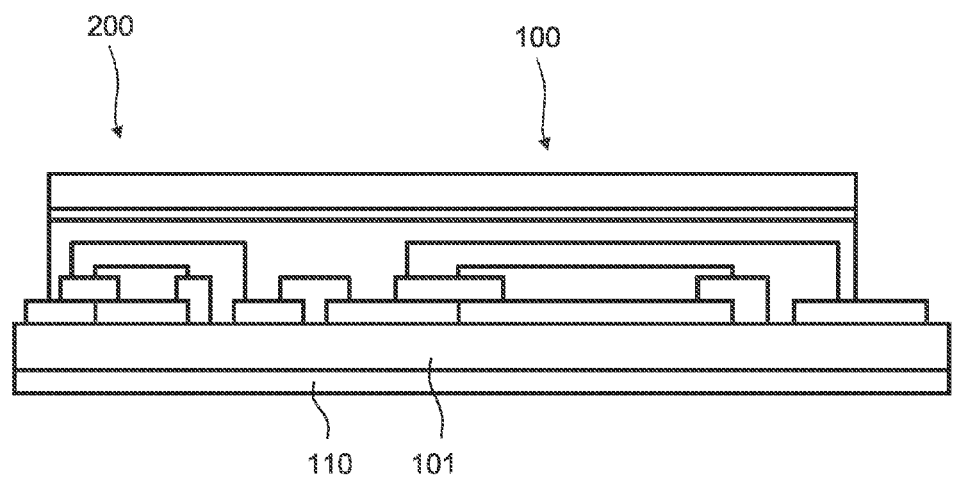
Figure 11:
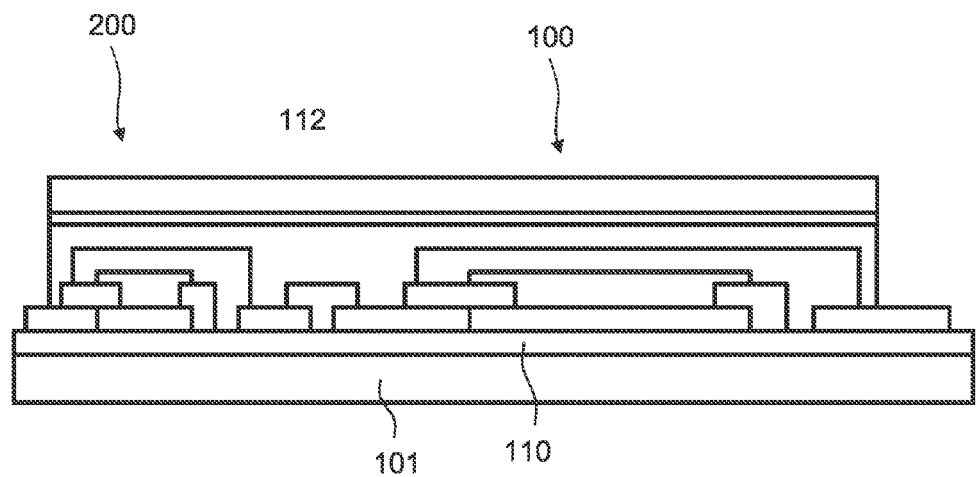

FIGS. 10 and 11 show further exemplary embodiments of an organic optoelectronic component in which the coupling-out layer 110 is varied in comparison with the exemplary embodiments shown previously.

In the exemplary embodiment in accordance with FIG. 10, the coupling-out layer 110 additionally also extends over the organic light detecting element 200, as a result of which, for example, the portion of the light guided internally from the organic light emitting element 100 to the organic light detecting element 200 and/or the portion of the ambient light coupled in can be varied.

In the exemplary embodiment in accordance with FIG. 11, the coupling-out layer 110 is arranged on that side of the common substrate 101 which faces the organic functional layer stacks, which can likewise result in influencing of the internally guided light and also of the ambient light coupled into the organic light detecting element 200.

As an alternative to the exemplary embodiments shown, a coupling-out layer can also be situated only above the organic light detecting element 200 or it is also possible for no coupling-out layer to be present. If the organic optoelectronic component, and in particular the organic light emitting element 100, is embodied as a top emitter or as a transparent OLED instead of a bottom emitter, one or a plurality of coupling-out layers in the variants described can also be arranged on the side facing away from the substrate, that is to say, for example, on the encapsulation. In particular, one or a plurality of coupling-out layers can be arranged externally, that is to say on an outer side, or internally, that is to say between other layers of the organic optoelectronic component.

Figure 12:
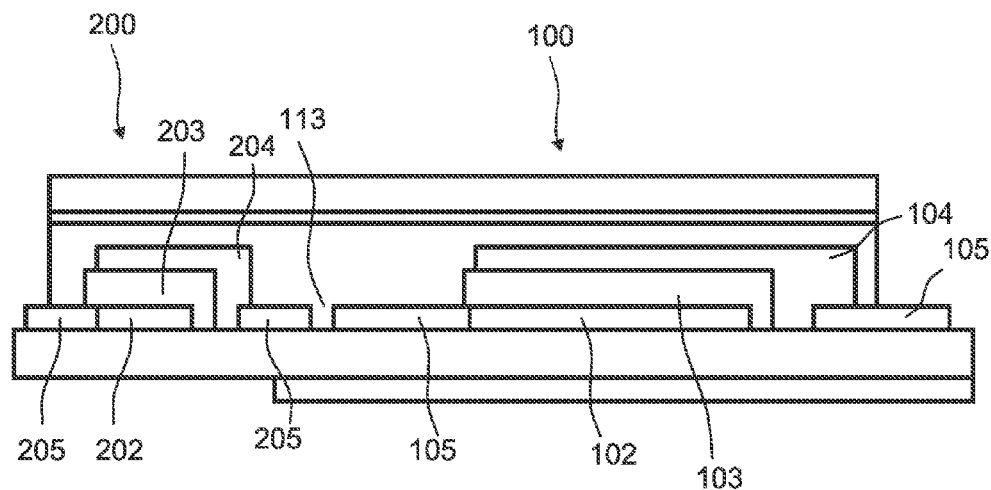

FIG. 12 shows a further exemplary embodiment of an organic optoelectronic component in which, in comparison with the exemplary embodiments shown previously, no insulator layers 106, 206, 112 are present. As a result, as already described in association with FIG. 3 in relation to the insulator layer 112, the portion of the light guided internally from the organic light emitting element 100 to the organic light detecting element 200 can be influenced, which light in this exemplary embodiment in particular can be radiated also directly from the organic light emitting element 100 onto the organic light detecting element 200. In particular, only an interspace 113 covered by the common encapsulation is present between the organic light emitting element 100 and the organic light detecting element 200. The electrodes 102, 104 and 202, 204 are formed, for example, by means of suitable mask processes during production in such a way that no short circuits arise even without insulator layers 106, 206 and the thus partially open organic layers.

FIGS. 13A to 16N show, in plan views of the emission side of the organic optoelectronic component, variation possibilities for the arrangement, the number and the position of organic light detecting elements 200, 200', 200" in relation to one or more light emitting elements 100 in accordance with a plurality of exemplary embodiments, wherein, for the sake of clarity, only the positions of the organic light emitting elements and of the organic light detecting elements are indicated, without exact illustration of the luminous area and the contact feeds.

The organic light detecting elements 200 shown in FIGS. 13A to 13F are embodied identically in each case and can detect ambient light on one side or on both sides in accordance with the previous exemplary embodiments.

Figure 13A:
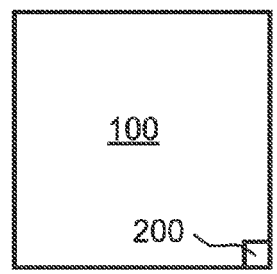
FIGS. 13A to 16N show schematic illustrations of organic optoelectronic components in accordance with further exemplary embodiments.
Figure 13B:
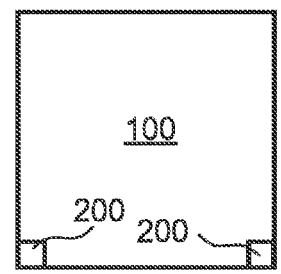
Figure 13C:
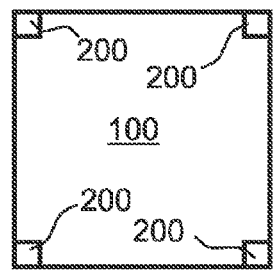

As is shown in FIG. 13A, by way of example, an organic light detecting element 200 can be situated in a corner or more generally in an edge region of an organic light emitting element 100, as a result of which the least possible influencing of the luminous area of the organic optoelectronic component can be achieved. As is shown in FIGS. 13B and 13C, a plurality of organic light detecting elements 200 can also be present, for example, in two corners or in all four corners of the organic light emitting element 100.

Figure 13D:
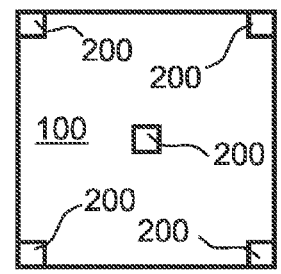
Figure 13E:
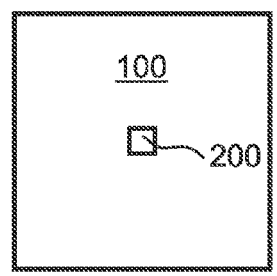

Furthermore, it is also possible, as is shown in FIGS. 13D and 13E, that in addition to edge regions an organic light detecting element 200 is also arranged within the luminous area formed by the organic light emitting element 100, wherein additionally, as is shown in FIG. 13D, organic light detecting elements 200 can be present in the edge regions and in particular in the corners of the organic light emitting element 100 or, as is shown in FIG. 13E, an organic light detecting element 200 can be present only within the luminous area of the organic light emitting element 100.

Figure 13F:
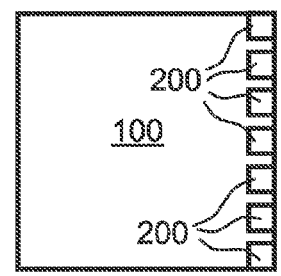

As is shown in FIG. 13F, by way of example, an entire edge side of an organic light emitting element 100 can also be provided with a multiplicity of organic light detecting elements 200.

FIGS. 14A to 15F show exemplary embodiments in which organic light detecting elements 200, 200', 200" are provided, which have different detection sides. Purely by way of example, the organic light detecting elements 200 have a detection side which enables detection of ambient light through the substrate, while the organic light detecting elements 200' enable detection of ambient light which is radiated onto the organic optoelectronic component on the side facing away from the substrate. The organic light detecting elements 200" are provided for detection on both sides.

Figure 14A:
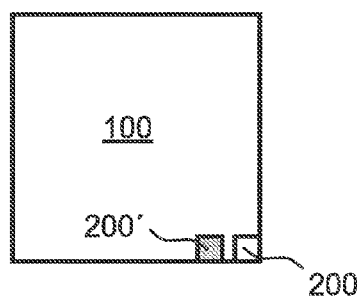
Figure 14B:
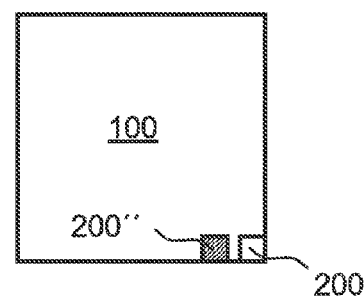

As is shown in FIGS. 14A and 14B, by way of example, an organic light detecting element 200 and a further organic light detecting element 200' having mutually different detection sides for ambient light can be present, or else an organic light detecting element 200 for detection on one side and a further organic light detecting element 200" for detection of ambient light on two sides.

Figure 14C:
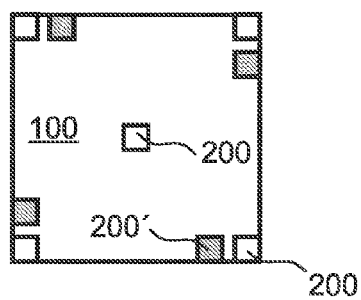
Figure 14D:
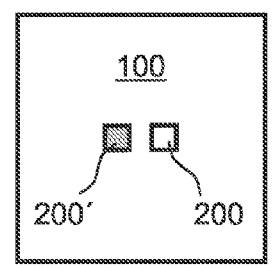
Figure 14E:
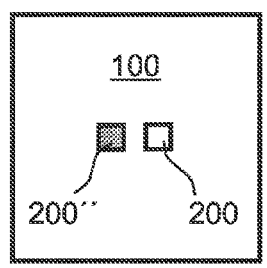

FIG. 14C shows an exemplary embodiment comprising a plurality of organic light detecting elements 200 and 200' in each case in pairs in the corners of the organic light emitting element 100, wherein an organic light detecting element 200 is additionally provided within the luminous area of the organic light emitting element 100. In the exemplary embodiments in FIGS. 14D and 14E, only two organic light detecting elements 200, 200' and 200, 200", respectively, are provided, which are situated within the luminous area of the organic optoelectronic element 100.

Figure 14F:
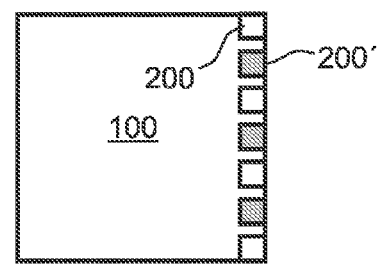
Figure 15A:
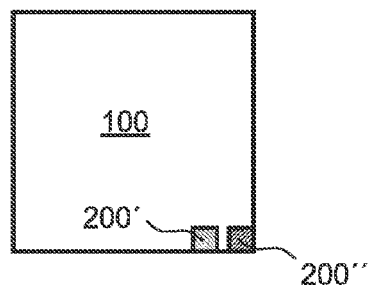
Figure 15B:
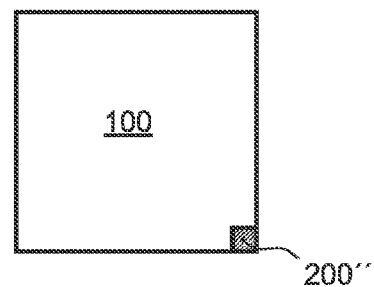
Figure 15C:
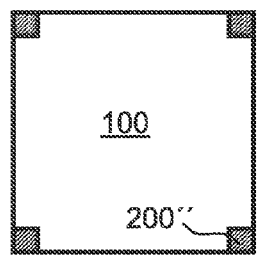
Figure 15D:
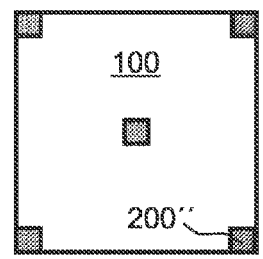
Figure 15E:
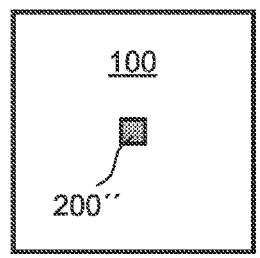
Figure 15F:
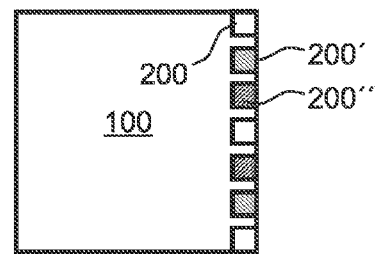

As is shown in FIG. 14F, a plurality of differently embodied organic light detecting elements 200, 200' can also extend over an edge region of the organic light emitting element 100.

FIGS. 15A to 15F show further exemplary embodiments, each comprising at least one organic light detecting element 200" which enables detection on both sides. In accordance with the exemplary embodiment in FIG. 15A an organic light detecting element 200' is additionally provided, while in accordance with the exemplary embodiment in FIG. 15B only one organic light detecting element 200" is provided in a corner region of the organic light emitting element 100. The exemplary embodiments in FIGS. 15C to 15E correspond to the exemplary embodiments in FIGS. 13C to 13E, wherein organic light detecting elements 200" that perform detection on both sides are explicitly provided here. In accordance with the exemplary embodiment in FIG. 15F, a plurality of differently embodied organic light detecting elements 200, 200', 200" having mutually different detection sides and detection on one side and on two sides are provided, which are distributed purely by way of example over an edge region of the organic light emitting element 100.

By means of a suitable choice and arrangement of one or a plurality of organic light detecting elements 200, 200', 200", an independent identification of a front- and rear-side illumination of the organic optoelectronic component may be possible. By this means, as also in the case of a plurality of organic light detecting elements 200, 200', 200" distributed over a luminous area of an organic light emitting element 100, an individual illumination control can be achieved. Furthermore, it may also be possible that a position sensor, for example, can be realized by means of a suitable choice and number of organic light detecting elements 200, 200', 200".

Figure 16H:
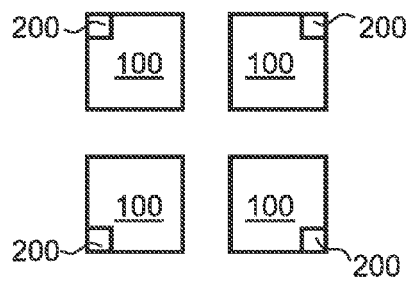
Figure 16J:
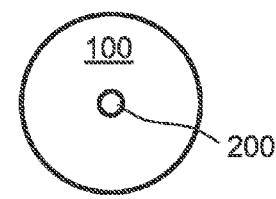
Figure 16I:
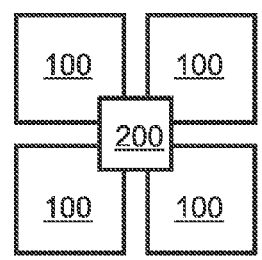
Figure 16K:
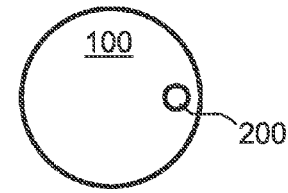
Figure 16M:
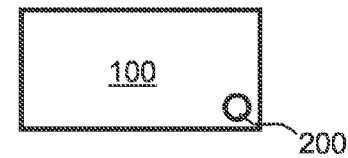
Figure 16L:
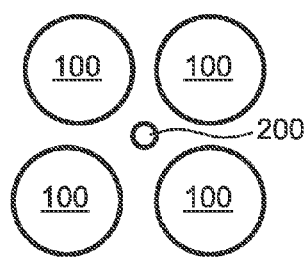
Figure 16N:
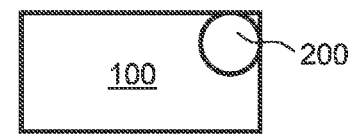

FIGS. 16A to 16N show further exemplary embodiments of the arrangement and the geometrical configuration of in each case a light emitting element 100 and a light detecting element 200, wherein the light detecting element 200 can be designed to perform detection on one side or on both sides. As is shown in FIG. 16A, the size of the organic light detecting element 200 can be varied, for example, in comparison with the previous exemplary embodiments in FIGS. 13A to 13F.

As is shown in FIG. 16B, the size and the shape of the light emitting element 100 can also be varied and can also have a rectangular or some other shape, for example, in comparison with the square shapes shown previously.

As is shown in FIG. 16C, an organic light detecting element 200 can also extend continuously over an entire edge side of an organic light emitting component 100.

As is shown in FIGS. 16D and 16E, an organic light detecting element 200 can, for example, be arranged in a region enclosed by the organic light emitting element 100 or subdivide a light emitting element 100 into two regions.

Furthermore, it is also possible that, as is shown in FIGS. 16F and 16G, a plurality of organic light emitting elements 100 are provided, wherein one or a plurality of organic light detecting elements 200 can be spaced apart from the plurality of organic light emitting elements 100 or else can be assigned directly to one of the organic light emitting elements 100. In the exemplary embodiment in FIG. 16H, in contrast thereto, each of the plurality of light emitting elements 100 is assigned an organic light detecting element 200, while in accordance with the exemplary embodiment in FIG. 16I an organic light detecting element 200 is provided which, in comparison with the previous exemplary embodiments, occupies a larger area and is assigned to all of the plurality of light emitting elements 100.

As is shown in FIGS. 16J to 16N, the organic light emitting elements 100 and/or the organic light detecting elements 200 can also have a shapes deviating from an angular shape, for example, a circular shape, an elliptic shape or any other shape and any other relative arrangement and size with respect to one another.

In particular, the exemplary embodiments shown in FIGS. 13A to 16N can be combined with one another arbitrarily depending on the application of the organic optoelectronic component.

Figure 17:
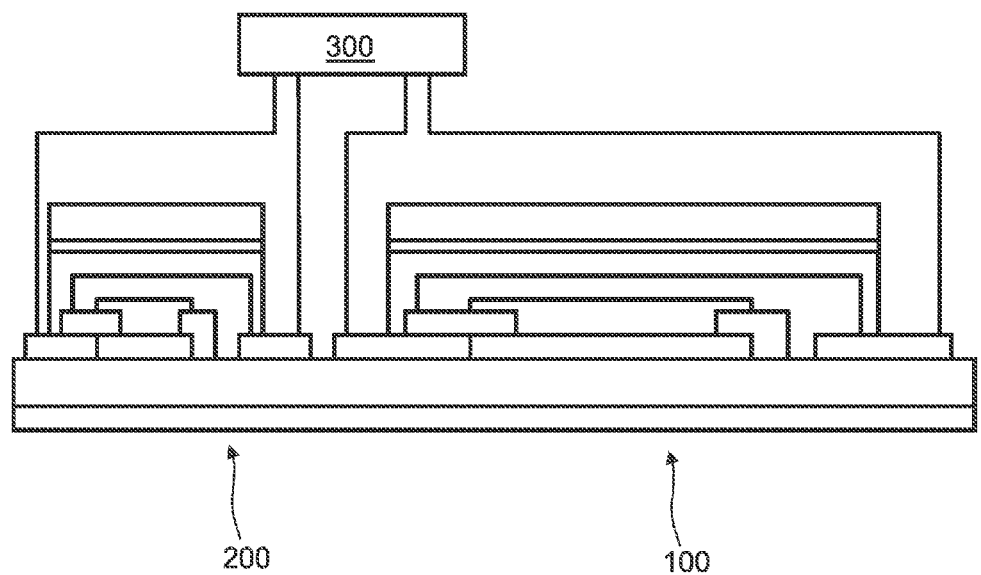
FIGS. 17 and 18 show schematic illustrations of organic optoelectronic components in accordance with further exemplary embodiments.
Figure 18:
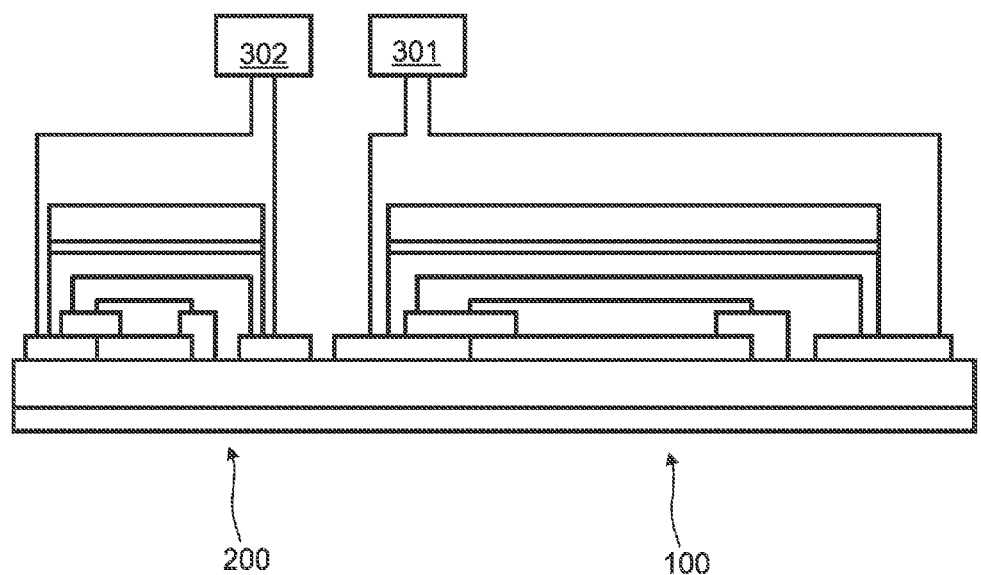

FIGS. 17 and 18 show organic optoelectronic components in accordance with further exemplary embodiments which comprise electronic components for electrical interconnections of the at least one organic light emitting element 100 and the at least one organic light detecting element 200.

Purely by way of example, in order to facilitate the illustration of the electrical contacting possibilities, the organic optoelectronic component in accordance with the exemplary embodiments in FIGS. 4A and 4B are shown with separate encapsulations. The interconnection possibilities shown in FIGS. 17 and 18 can also be combined with the other exemplary embodiments.

In the exemplary embodiment in FIG. 17, a regulatable current and/or voltage source 300 is provided as electronic component and measures the electrically measurable signal which is provided by the at least one organic light detecting element 200 and which is generated by detection of ambient light on one side or on both sides depending on the embodiment of the organic light detecting element 200, and regulates the at least one organic light emitting element 100 depending on the measurement. The exemplary embodiment shown in FIG. 17 makes it possible, in particular, to carry out a method for operating an organic optoelectronic component, wherein a regulatable current and/or voltage source 300 is provided, which measures the light which is detected by the at least one organic light detecting element 200 and which comprises ambient light, and regulates the at least one organic light emitting element 100 depending on the measurement. The regulatable current and/or voltage source 300 can operate, for example, with regulatable current and/or voltage amplitudes, a pulse width modulation method and/or a pulse frequency modulation method.

As is shown in FIG. 17, the regulatable current and/or voltage source 300 can be an external electronic component which is interconnected with the elements 100, 200 via suitable wire connections or conduction tracks. As an alternative thereto, it may also be possible to integrate a regulatable current and/or voltage source at least partly into the organic optoelectronic component, for example, by integration into the common substrate or by arrangement on the common substrate. In other words, the regulatable current and/or voltage source 300 can be provided as a monolithic electronic circuit, for example, in the substrate or in additional functional layers on the substrate. The regulatable current and/or voltage source 300 can have presetting possibilities which enable, for example, a desired brightness to be set depending on the ambient light of the optoelectronic component.

FIG. 18 shows one exemplary embodiment of an organic optoelectronic component which comprises, instead of a regulatable current and/or voltage source 300 that converts the measurement signal provided by the organic light detecting element 200 into a control signal for the organic light emitting element 100, a current and/or voltage source 301 separate from a current and/or voltage measuring instrument 302, which enable operation of the organic optoelectronic component without direct feedback, wherein the signal of the organic light detecting element 200 is merely measured.

The features and exemplary embodiments described in association with the figures can be combined with one another in accordance with further exemplary embodiments, even if such combinations are not explicitly described with the individual figures. Furthermore, the exemplary embodiments shown in the figures can have further or alternative features in accordance with the general description.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An organic optoelectronic component comprising:
   at least one organic light emitting element comprising an organic functional layer stack having at least one organic light emitting layer between two electrodes; and
   at least one organic light detecting element comprising at least one organic light detecting layer, wherein the at least one organic light detecting element and the at least one organic light emitting element are laterally adjacent arranged on a common substrate,
   wherein the electrodes and the organic functional layer stack of the at least one light emitting element are separated from electrodes and an organic functional layer stack of the at least one light detecting element,
   wherein a plurality of organic light detecting elements is arranged on the common substrate,
   wherein at least one of the plurality of organic light detecting elements is configured to detect ambient light through the substrate, wherein at least another one of the plurality of organic light detecting elements is configured to detect ambient light from an opposite side of the organic optoelectronic component relative to the substrate, or
   wherein at least two of the plurality of light detecting elements have different detection sides for detecting ambient light.

2. The component according to claim 1, wherein the at least one organic light detecting element comprises an organic photodiode, an organic photoconductor or an organic photoresistor.

3. The component according to claim 1, wherein the at least one organic light detecting element is configured to detect ambient light through the substrate.

4. The component according to claim 1, wherein the at least one organic light detecting element is configured to detect ambient light radiated onto the organic optoelectronic component from an opposite side of the organic optoelectronic component relative to the substrate.

5. The component according to claim 1, wherein the at least one organic light emitting element is configured to emit light on an emission side of the organic optoelectronic component, and wherein the at least one organic light detecting element is configured to detect ambient light radiated onto the organic optoelectronic component on a different side than the emission side.

6. The component according to claim 1, wherein the at least one organic light emitting element is configured to emit light on an emission side of the organic optoelectronic component, and wherein the at least one organic light detecting element is configured to detect ambient light radiated onto the organic optoelectronic component on the emission side.

7. The component according to claim 1, wherein a plurality of organic light emitting elements are arranged on the common substrate.

8. The component according to claim 7, wherein in each case at least one organic light detecting element is assigned to at least two of the plurality of organic light emitting elements.

9. The component according to claim 1, wherein the at least one organic light emitting element and the at least one organic light detecting element are encapsulated with a common encapsulation, wherein between the at least one organic light emitting element and the at least one organic light detecting element an electrical insulator layer is arranged, and wherein the electrical insulator layer is directly arranged on the substrate and covered by a common encapsulation.

10. The component according to claim 1, wherein the at least one organic light emitting element and the at least one organic light detecting element are encapsulated with a common encapsulation, and wherein between the at least one organic light emitting element and the at least one organic light detecting element the common encapsulation is arranged directly on the substrate.

11. The component according to claim 1, wherein the at least one organic light emitting element is encapsulated with a first encapsulation and the at least one organic light detecting element is encapsulated with a second encapsulation.

12. The component according to claim 11, wherein an electrical insulator layer is arranged between the at least one organic light emitting element and the at least one organic light detecting element, the electrical insulator layer being arranged between the first and second encapsulations in a lateral direction.

13. The component according to claim 1, wherein an optical coupling-out layer is arranged on an emission side of the organic optoelectronic component on an outer side or between other layers of the organic optoelectronic component.

14. A method for operating an organic optoelectronic component according to claim 1, the method comprising:
  applying a current and/or voltage to the organic optoelectronic component;
  measuring ambient light by detecting the ambient light by the at least one organic light detecting element; and
  regulating the at least one organic light emitting element by regulating the current and/or voltage based on the measurement.

15. The method according to claim 14, wherein a regulatable current and/or voltage source is at least partly integrated into the organic optoelectronic component.

16. An organic optoelectronic component comprising:
  at least one organic light emitting element and a plurality of organic light detecting elements arranged laterally adjacent on a common substrate,
  wherein the at least one organic light emitting element comprises an organic functional layer stack having at least one organic light emitting layer between two electrodes,
  wherein each of the plurality of organic light detecting elements comprises at least one organic light detecting layer,
  wherein at least one of the plurality of organic light detecting elements is configured to detect ambient light through the substrate, wherein at least another of the plurality of organic light detecting elements is configured to detect ambient light from an opposite side of the organic optoelectronic component relative to the substrate,
  or wherein at least two of the plurality of light detecting elements have different detection sides for detecting ambient light.

17. An organic optoelectronic component comprising:
  at least one organic light emitting element comprising an organic functional layer stack having at least one organic light emitting layer between two electrodes; and
  at least one organic light detecting element comprising at least one organic light detecting layer, wherein the at least one organic light detecting element and the at least one organic light emitting element are laterally adjacent arranged on a common substrate,
  wherein the electrodes and the organic functional layer stack of the at least one light emitting element are separated from electrodes and an organic functional layer stack of the at least one light detecting element,
  wherein a plurality of organic light detecting elements is arranged on the common substrate,
  wherein at least two of the plurality of light detecting elements have different detection sides for detecting ambient light, and
  wherein a plurality of organic light emitting elements is arranged on the common substrate.

18. An organic optoelectronic component comprising:
  at least one organic light emitting element comprising an organic functional layer stack having at least one organic light emitting layer between two electrodes; and
  at least one organic light detecting element comprising at least one organic light detecting layer, wherein the at least one organic light detecting element and the at least one organic light emitting element are laterally adjacent arranged on a common substrate,
  wherein the electrodes and the organic functional layer stack of the at least one light emitting element are separated from electrodes and an organic functional layer stack of the at least one light detecting element, and wherein an optical coupling-out layer is arranged on an emission side of the organic optoelectronic component on an outer side or between other layers of the organic optoelectronic component.

* * * * *